United States Patent
Linares et al.

(10) Patent No.: US 9,227,343 B2
(45) Date of Patent: *Jan. 5, 2016

(54) GEMSTONE PRODUCTION FROM CVD DIAMOND PLATE

(71) Applicant: SCIO Diamond Technology Corporation, Greer, SC (US)

(72) Inventors: Robert C. Linares, Wellfleet, MA (US); Patrick J. Doering, Holliston, MA (US)

(73) Assignee: SCIO Diamond Technology Corporation, Greer, SC (US)

( * ) Notice: Subject to any disclaimer, the term of this patent is extended or adjusted under 35 U.S.C. 154(b) by 302 days.

This patent is subject to a terminal disclaimer.

(21) Appl. No.: 13/731,936

(22) Filed: Dec. 31, 2012

(65) Prior Publication Data

US 2013/0192579 A1    Aug. 1, 2013

Related U.S. Application Data

(63) Continuation of application No. 12/463,142, filed on May 8, 2009, now Pat. No. 8,342,164.

(60) Provisional application No. 61/051,859, filed on May 9, 2008.

(51) Int. Cl.
| | |
|---|---|
| B28D 5/00 | (2006.01) |
| A44C 17/00 | (2006.01) |
| C23C 16/27 | (2006.01) |
| C23C 16/56 | (2006.01) |
| C30B 25/02 | (2006.01) |
| C30B 29/04 | (2006.01) |

(52) U.S. Cl.
CPC ............... *B28D 5/00* (2013.01); *A44C 17/001* (2013.01); *C23C 16/27* (2013.01); *C23C 16/56* (2013.01); *C30B 25/02* (2013.01); *C30B 29/04* (2013.01)

(58) Field of Classification Search
USPC ........................ 125/30.01, 39; 63/32
See application file for complete search history.

(56) References Cited

U.S. PATENT DOCUMENTS

| | | | | |
|---|---|---|---|---|
| 839,356 | A * | 12/1906 | Wood et al. | 125/30.01 |
| 5,711,698 | A * | 1/1998 | Chakraborty et al. | 451/41 |
| 6,096,129 | A * | 8/2000 | Saito et al. | 117/84 |
| 7,000,607 | B2 * | 2/2006 | Davidi | 125/30.01 |
| 7,128,974 | B2 * | 10/2006 | Scarsbrook et al. | 428/408 |
| 7,887,628 | B2 * | 2/2011 | Scarsbrook et al. | 106/286.8 |
| 8,342,164 | B2 * | 1/2013 | Linares et al. | 125/30.01 |
| 2002/0096167 | A1 * | 7/2002 | Shuto | 125/30.01 |
| 2004/0177803 | A1 * | 9/2004 | Scarsbrook et al. | 117/68 |
| 2010/0059034 | A1 | 3/2010 | Linares et al. | |

OTHER PUBLICATIONS

"U.S. Appl. No. 12/463,142, Non Final Office Action mailed Dec. 23, 2011", 6 pgs.
"U.S. Appl. No. 12/463,142, Notice of Allowance mailed Aug. 31, 2012", 7 pgs.

* cited by examiner

*Primary Examiner* — Dung Van Nguyen

(74) *Attorney, Agent, or Firm* — Schwegman Lundberg & Woessner, P.A.

(57) ABSTRACT

A method of producing gemstones includes obtaining a plate of chemical vapor deposition formed diamond. The plate is cut into a plurality of geometrically optimized preforms. The preforms may be finished and cut into diamond gemstones.

18 Claims, 3 Drawing Sheets

GEMSTONE PRODUCTION FROM CVD DIAMOND PLATE

CROSS-REFERENCE TO RELATED APPLICATIONS

This application is a continuation of U.S. patent application Ser. No. 12/463,142 (issuing as U.S. Pat. No. 8,342,164 on Jan. 1, 2013), filed May 8, 2009, and entitled "GEMSTONE PRODUCTION FROM CVD DIAMOND PLATE," which claims priority to U.S. Provisional Application Ser. No. 61/051,859, filed May 9, 2008, and entitled "GEMSTONE PRODUCTION FROM CVD DIAMOND PLATE," the entire disclosure of which is incorporated by reference herein.

BACKGROUND

Natural gemstones, such as diamonds have been mined for centuries. The raw mined diamond may be irregularly shaped, and may be cut to optimize the size and shape of a finished gemstone. Much skill goes into selecting the cut of a raw stone and the actual process of cutting the stone to a desired shape.

In natural or high temperature, high pressure manufactured stones, the yield of the gemstone into finished cut stone is dictated by the shape and orientation of the unfinished stone, which can range from perfect crystals to irregular shapes. This results in an average yield of gemstones of less than 50 percent and usually about 30%.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

In natural or high temperature, high pressure (hthp) crystals, the yield of gemstones is dictated by the shape and orientation which can vary from perfect crystals to irregular shapes. This results in an average yield of gemstones of less than 50 percent and mostly about 30%.

Chemical vapor deposition (CVD) diamond crystals can be made as large flattish plates by choosing appropriate growing conditions and seed geometry. The growth of such large flattish plates enables unique fabrication options which are not available to natural or hthp man made diamond crystals.

Figure 1:
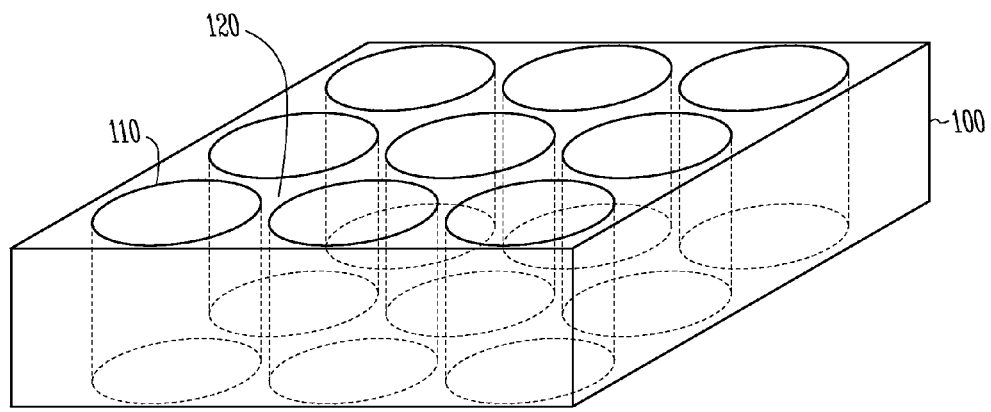
FIG. 1 is a block diagram of a diamond plate with cylindrical preforms indicated according to an example embodiment.

In one embodiment, a large CVD plate 100 in FIG. 1 can be cut into an array of cylinders 110 of exact or variable sizes to optimize the yield of round stones from the blank crystal. This results in multiple cylindrical preforms that may be cut into desired gemstones. The preforms may be geometrically optimized to provide a high yield from the plate 100. Such optimization may involve determining how to obtain the most preforms from the plate by taking into account minimization of cuts and optimization of plate utilization. Cylinders will give a theoretical yield of 43% cut diamond gemstones, plus an additional yield of stones, such as smaller stones or baguettes cut from interstices between the cylinders indicated at 120.

In one embodiment, the same size cylinders may be cut from the plate, resulting in a geometric pattern as shown in FIG. 1. In further embodiments, rows of cylinders may be slightly offset from each other if the plate is not a perfect square to geometrically optimize the yield of the plate. Using different size preforms may result in further yield increase and even different looking patterns of preforms to be cut from the plate.

In one embodiment, the cylindrical preforms may be used to form round brilliant cut gemstones. The cutting may be done by laser with a highly focused beam to minimize waste and obtain high intensity. Blue or different wavelengths may be used depending on the type of laser and speed of cutting desired. Double or triple YAG lasers may be used. Semiconductor lasers may also be used if they can be made to generate sufficient power. In further embodiments, electro discharge machines (EDM) may be used to cut the preforms from the plate and further cut the preforms into desired gemstones.

Figure 2:
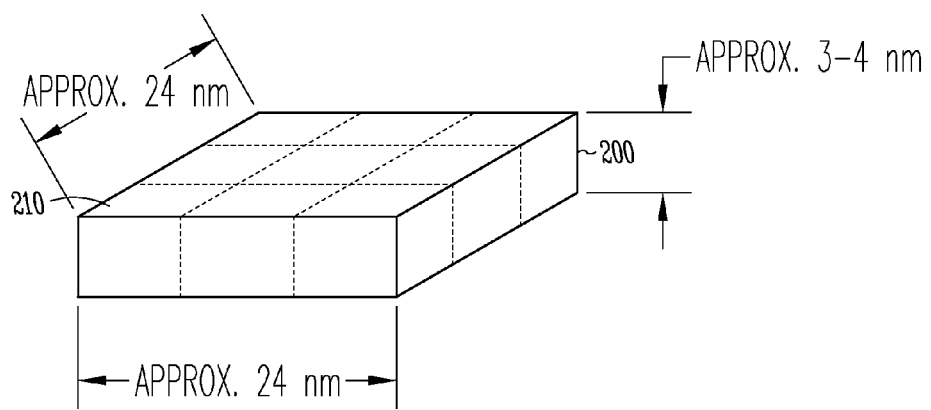
FIG. 2 is a block diagram of a diamond plate with square preforms indicated according to an example embodiment.

In an alternative embodiment, a large CVD diamond gemstone plate 200 in FIG. 2 is into squares 210 or rectangles, forming preforms which may then be cut into emerald, cushion, princes, round brilliant and other cuts of gemstones. The rectangular cut enables further cutting of corners to increase the yield of diamond and enable production of smaller sizes also. Total yield will approach 50 percent.

Figure 3:
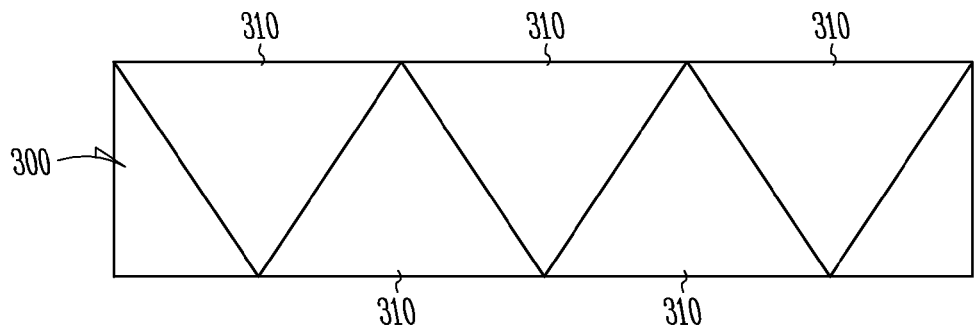
FIG. 3 is a block diagram of a diamond plate with wedge shaped preforms indicated according to an example embodiment.

In a further embodiment, a large CVD diamond gemstone plate 300 in FIG. 3 is cut into a series of preforms in the shape of wedges 310, which then can be further cut into emerald, cushion, princes, round brilliant and so forth. The yield of this cutting may be over 60%. Using a large area plate in combination with laser cutting provides a large number of cut gems having identical color as they may be fabricated at one time and are formed from a the same size preforms cut from a uniform thickness plate. The ability to make highly matched gems in terms of shape, size, and color is highly desirable for jewelry designers. Moreover, it is possible to cut a large variety of shapes from the same crystal and all will have the same color and clarity. In addition, a further advantage of using flat plates is that the properties of large plates can be more readily measured in production by manual or automated machinery similar to what my be used in the semiconductor industry. The cutting itself may be highly automated and use a number of different available high power laser wavelengths.

In one embodiment, a flat plate of single crystal CVD diamond may be formed. The dimensions of such a plate in one embodiment are approximately 24 mm by 24 mm by approximately 3-4 mm. The thickness of the plate can be tailored to the thickness required for the desired size and shape gemstones. Such tailoring can be accommodated during the growth process (grow to desired thickness) and/or during post growth fabrication (such as laser processing). As processes for growing CVD diamond improve, the size of the flat plate is likely to increase in both width, as well as depth. Such a plate may be formed with a defective perimeter (unsuitable for gem stones), which can be removed via acid etching, oxygen etching, (or other chemical means), or laser trimming or other methods either when in plate form or preform form.

The preforms may then be cut by the use of a laser or saw or other means. Once the preforms are separated from the plate, they are ready for finishing, which may include cutting and polishing. In one embodiment, a large single crystal seed is used to grow the plate using CVD. In such plates, the seed, and a seed interface between the grown diamond plate and seed may be removed. This may be done at the plate level, or at the preform level as desired. The preforms may then be prelaser cut/scored, and then formed into desired cuts of gemstones.

Figure 4:
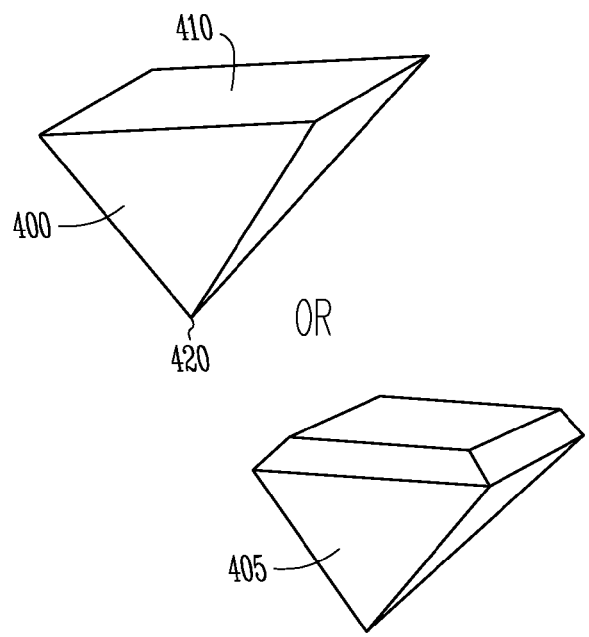
FIG. 4 is a block diagram of a pyramid shaped preform obtained from a diamond plate according to an example embodiment.

In FIG. 4, a preform 400 or 405 may be obtained in a pyramid shape from a plate of diamond, increasing yield potential even further. The pyramid preforms can be geometrically optimized by forming an array of pyramid tops 410 on a top side of the plate. The pyramid bottoms 420 are essentially points on the bottom side of the plate, and define corners of a second array of pyramid tops formed on such bottom side of the plate. The second array is basically offset one-half the width of the pyramid tops from the first array on the top side of the plate.

As can be seen the pyramid shaped preform utilizes almost the entire plate of diamond to form the preforms, with diamond material at the edge of the plate being the only material that is not used in forming the pyramid preforms. With larger and larger plates, such unused material may be less and less of the total amount of material in the plate. The unused material may be used for forming smaller stones, increasing overall plate yield even higher.

As indicated with respect to the cylindrical preforms 110, the other preforms described herein may also be geometrically optimized to increase the yield of gemstone obtained from CVD grown diamond plate. In still further embodiments, different size preforms may be used to geometrically optimize the yield, and in yet further embodiments, different types and sizes of preforms may be obtained from a plate to further optimize yield.

In one embodiment, a computer program may be used to consider a variety of cuts and sizes or weights that may be obtained from a plate. Multiple different sets of stones that can be cut from the plate may be considered in one embodiment. A projected dollar value of each of the sets of stones may be used to determine an optimal set of stones to be cut. In a further embodiment, the valuation may be based on the preforms that can be obtained from a plate. In some instances, a matched set of smaller stones may be more valuable than a smaller set of larger stones. A matched set of graded stones may also be considered. In still further embodiments, existing orders for stones may be used to help determine how to cut each plate, or a number of plates. For example, an order for 3000 ½ carat stones may be pending, but a plate may not yield an optimal number of ½ carat stones. Depending on the value of a different set of stones obtainable from the plate, versus the need to fill the order, a decision may be made to cut the plate one way or the other. The plate may be 25 mil by 24 mil and 3 mil thick. If a 5×5 mil portion of the plate is needed for each ½ carat stone, four rows of such stone may be available, with the final 4 mil used for a mix of different stones. Or, the entire plate could be optimized independent of the need for ½ carat stones. In still further embodiments, various algorithms may be used to obtain an optimal set of preforms or finished stones without directly considering different sets that may be derived from a plate.

In one example, a 4 mil thick plate may be used to form one or more one carat round brilliant cut stones. The plate may be cut to provide a mix of emerald and round pairs to provide the optimum value from the plate. In further embodiments, it may make sense for tax purposes to leave the plate uncut, cut it into preforms, or finish the preforms into the final cut and polished stones.

Figure 5:
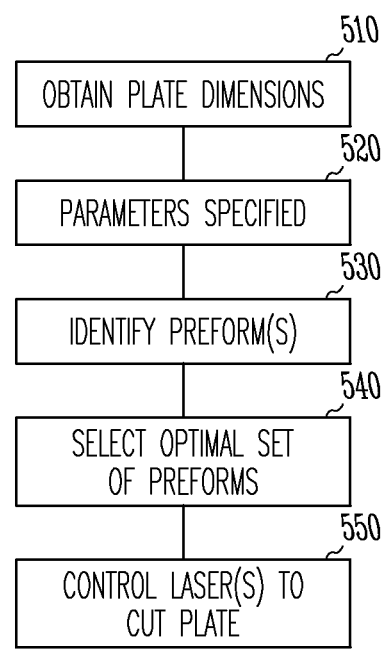
FIG. 5 is a flowchart of a computer implemented method of selecting an optimal set of preforms from a diamond plate according to an example embodiment.

FIG. 5 is a flowchart of a method 500 describing a computer program that may be implemented on many different types of computers having one or more processors, memory devices, busses, I/O devices, monitors, network adapters and other components. In one embodiment, a personal computer may be used to run software implementing the method 500.

At 510, dimensions of a plate of single crystal chemical vapor deposition manufactured diamond are provided. Parameters for specifying desired optimization factors for the method 500 are provided at 520. At 530, one or more sets of preforms are identified as a function of one or more of the provided parameters. The parameters may identify different types of stones that are desired, such as different cuts, different desired weights in carats, whether matched sets, or graded matched sets are desired, and whether to optimize based on desired stones or highest value set of stones or preforms. In further embodiments, may different parameters may be used to determine an optimal set of preforms to cut. At 540, an optimal set of preforms is selected based on one or more of the parameters, such as optimization of value.

In some embodiments, computer controlled lasers are used to perform the cutting of the plate into the preforms and finished stones as indicated at 550.

The Abstract is provided to comply with 37 C.F.R. §1.72(b) to allow the reader to quickly ascertain the nature and gist of the technical disclosure. The Abstract is submitted with the understanding that it will not be used to interpret or limit the scope or meaning of the claims.

What is claimed is:

1. A method comprising:
   obtaining a plate of chemical vapor deposition formed diamond;
   cutting the plate into a plurality of geometrically optimized preforms; and
   finishing the preforms into cut diamond gemstones;
   wherein cutting the plate into a plurality of geometrically optimized preforms yields a plurality of interstices; and
   wherein the plurality of interstices are finished into cut diamond gemstones.

2. The method of claim 1, wherein the geometrically optimized preforms are cylindrical.

3. The method of claim 2, wherein the cut diamond gemstones represent at least a 43% yield from the plate.

4. The method of claim 1, wherein the geometrically optimized preforms have a square cross-section.

5. The method of claim 4, wherein the cut diamond gemstones represent at least a 50% yield from the plate.

6. The method of claim 1, wherein the geometrically optimized preforms have a rectangular cross-section.

7. The method of claim 6, wherein the cut diamond gemstones represent at least a 50% yield from the plate.

8. The method of claim 1, wherein the geometrically optimized preforms are wedges.

9. The method of claim 8, wherein the cut diamond gemstones represent at least a 60% yield from the plate.

10. The method of claim 1, wherein the geometrically optimized preforms are pyramids.

11. The method of claim 10, wherein cutting the plate into a plurality of geometrically optimized preforms includes cutting the plate into a first array of pyramids and a second array of pyramids, wherein the first array of pyramids is inverted and offset from the second array of pyramids.

12. The method of claim 1, wherein the plurality of interstices are finished into baguette diamonds.

13. A method comprising:
 obtaining a plate of chemical vapor deposition formed diamond;
 receiving at least one optimization parameter, the optimization parameter including an instruction to optimize a number of cuts;
 generating, using the at least one optimization parameter, a plurality of geometrically optimized preforms;
 cutting the plate into the plurality of geometrically optimized preforms; and
 finishing the preforms into cut diamond gemstones.

14. The method of claim 13, wherein receiving the at least one optimization parameter further includes receiving an instruction to optimize the number of cuts to yield a diamond cut gemstone.

15. The method of claim 13, wherein receiving the at least one optimization parameter further includes receiving an instruction to optimize the number of cuts to yield a diamond gemstone weight in carats.

16. The method of claim 13, wherein receiving the at least one optimization parameter further includes receiving an instruction to generate a matched set.

17. The method of claim 16, wherein receiving the at least one optimization parameter further includes receiving an instruction to generate a graded matched set.

18. The method of claim 13, wherein receiving the at least one optimization parameter further includes receiving an instruction to prioritize optimization based on yielding highest value for cut diamond gemstones.

* * * * *